US010210970B2

(12) United States Patent
Ma et al.

(10) Patent No.: US 10,210,970 B2
(45) Date of Patent: Feb. 19, 2019

(54) METALLIC-MAGNETIC-DOMAIN-WALL-BASED NONVOLATILE TUNABLE RESISTOR FOR MEMORY AND SENSOR APPLICATIONS

(71) Applicants: The Board of Trustees of the Leland Stanford Junior University, Palo Alto, CA (US); RIKEN, Saitama (JP)

(72) Inventors: Yue Ma, Stanford, CA (US); Yongtao Cui, Palo Alto, CA (US); Kentaro Ueda, Tokyo (JP); Jun Fujioka, Tokyo (JP); Yoshinori Tokura, Tokyo (JP); Zhixun Shen, Stanford, CA (US); Robert B. Laughlin, Stanford, CA (US)

(73) Assignees: The Board of Trustees of the Leland Stanford Junior University, Stanford, CA (US); RIKEN, Saitama (JP)

( * ) Notice: Subject to any disclaimer, the term of this patent is extended or adjusted under 35 U.S.C. 154(b) by 69 days.

(21) Appl. No.: 15/160,914

(22) Filed: May 20, 2016

(65) Prior Publication Data

US 2016/0343481 A1 Nov. 24, 2016

Related U.S. Application Data

(60) Provisional application No. 62/165,137, filed on May 21, 2015.

(51) Int. Cl.
*H01C 1/14* (2006.01)
*H01L 43/08* (2006.01)
(Continued)

(52) U.S. Cl.
CPC ............. *H01C 1/14* (2013.01); *H01C 10/103* (2013.01); *H01L 43/08* (2013.01); *H01L 43/10* (2013.01)

(58) Field of Classification Search
CPC ......... H01C 1/14; H01C 10/103; H01L 43/08; H01L 43/10
(Continued)

(56) References Cited

U.S. PATENT DOCUMENTS 5,766,743 A * 6/1998 Fujikata .............. H01F 10/3268
324/252
6,579,612 B1 * 6/2003 Lille ...................... G01R 33/18
257/E29.324
(Continued)

FOREIGN PATENT DOCUMENTS

WO WO2008143381 11/2008

OTHER PUBLICATIONS

Du et al., "Domain Wall Conductivity in Oxygen Deficient Multiferroic YMnO3 Single Crystals", 2011, Applied Physics Letters v99, pp. 252107.
(Continued)

*Primary Examiner* — Kyung Lee
*Assistant Examiner* — Iman Malakooti
(74) *Attorney, Agent, or Firm* — Lumen Patent Firm

(57) ABSTRACT

Control of electrical conductivity is provided via electrically conductive magnetic domain walls between magnetic domains. The magnetic domains are identical except for their magnetic configuration. Altering a configuration of the magnetic domains (e.g., by thermal treatment, application of a magnetic field, etc.) can alter the electrical resistance of a device. Such devices can be used as non-volatile information storage devices or as sensors.

10 Claims, 8 Drawing Sheets

(51) Int. Cl.
   *H01C 10/10* (2006.01)
   *H01L 43/10* (2006.01)
(58) Field of Classification Search
   USPC ........................................... 338/32 R
   See application file for complete search history.

(56) References Cited

U.S. PATENT DOCUMENTS

| | | | | |
|---|---|---|---|---|
| 6,602,620 | B1* | 8/2003 | Kikitsu | G11B 5/7325 |
| | | | | 428/838 |
| 6,714,374 | B1* | 3/2004 | Hayashi | G01R 33/09 |
| | | | | 257/E43.004 |
| 6,727,537 | B2 | 4/2004 | Wunderlich | |
| 2004/0036571 | A1* | 2/2004 | Chen | G11C 11/5685 |
| | | | | 338/32 R |
| 2004/0189295 | A1* | 9/2004 | Sato | B82Y 25/00 |
| | | | | 428/692.1 |
| 2008/0024910 | A1 | 1/2008 | Seigler | |
| 2009/0065757 | A1* | 3/2009 | Sawa | G11C 13/0007 |
| | | | | 257/4 |
| 2011/0308580 | A1* | 12/2011 | Seidel | B82Y 10/00 |
| | | | | 136/252 |

OTHER PUBLICATIONS

Seidel et al., "Conduction at domain walls in oxide multiferroics", 2009, Nature Materials v8, pp. 229-234.
Slater, "Magnetic effects and the Hartree-Fock equation", 1951, Physical Review v82n4, pp. 538-541.
Poilblanc et al., "Charged solitons in the Hartree-Fock approximation to the large-U Hubbard model", 1989, Physical Review B v39n13, pp. 9749-9752.
Inui et al., "Hartree-Fock study of the magnetism in the single-band Hubbard model", 1991, Physical Review B v44n9, pp. 4415-4422.
Wan et al., "Topological semimetal and Fermi-arc surface states in the electronic structure of pyrochlore iridates", 2011, Physical Review B v83 pp. 205101:1-9.
Ueda et al, "Anomalous domain-wall conductance in pyrochlore-type $Nd_2Ir_2O_7$ on the verge of the metal-insulator transition", 2014, Physical Review B v89, pp. 075127:1-5.
Schulz, "Incommensurate antiferromagnetism in the two-dimensional Hubbard model", 1990, Physical Review Letters v64n12, pp. 1445-1448.
Yamaji et al, "Metallic Interface Emerging at Magnetic Domain Wall of Antiferromagnetic Insulator: Fate of Extinct Weyl Electrons", 2014, Physical Review X v4, pp. 021035:1-27.

* cited by examiner

METALLIC-MAGNETIC-DOMAIN-WALL-BASED NONVOLATILE TUNABLE RESISTOR FOR MEMORY AND SENSOR APPLICATIONS

CROSS REFERENCE TO RELATED APPLICATIONS

This application claims the benefit of U.S. provisional patent application No. 62/165,137, filed on May 21, 2015, and hereby incorporated by reference in its entirety.

FIELD OF THE INVENTION

This invention relates to control of electrical conductance by altering a magnetic domain configuration in a magnetic material.

BACKGROUND

Various physical effects have been considered for providing non-volatile information storage devices. One such effect that has been considered in the art is conductive ferroelectric domain walls in otherwise insulating ferroelectric materials. Altering a configuration of the ferroelectric domain walls can alter the electrical resistance of a device. Since the ferroelectric domain wall configuration is non-volatile, the resulting device has an adjustable and non-volatile resistance, making it useful for various applications such as information storage. US 2011/0308580 is a representative example of this work.

However, manipulation of ferroelectric domains is generally undesirable because it necessarily involves motion of the atoms in the ferroelectric material. Ferroelectric domains are defined by a deformation of the crystal unit cells that leads to a net electrical polarization of the domain. Thus altering the domain configuration in a ferroelectric material involves changing this deformation of the unit cells. This means that ferroelectric switching is usually slow because the atoms have to move. Ferroelectric switching may also lead to unreliable devices, because this amounts to 'moving parts' within the material, which can lead to failure via mechanical fatigue etc.

Accordingly, it would be an advance in the art to provide control of electrical conductivity via conductive domain walls by altering domain configurations in a manner that does not involve movement of atoms.

SUMMARY

We provide a nonvolatile tunable resistor based on conductive magnetic domain walls in a magnetic insulator. Such a resistor can be readily made into direct electronically readable memory devices or sensors.

The working principle of such a tunable resistor is illustrated in FIG. 1. When a multi-domain state is prepared and there is at least one magnetic domain wall (DW) spanning the two electrodes, one measures a small resistance, because the domain wall is conductive. One can then manipulate the domains with an external magnetic field, heat pulse, strain or electric field, such that a reduced number of DWs (including 0 DW) are spanning the two electrodes. This gives rise to a larger resistance. In the case of zero DW spanning the electrodes, because the bulk material is insulating, the resistance can be many orders of magnitude higher than the resistance obtained with at least one DW spanning the electrodes.

Once such a tunable resistor is realized, it automatically becomes a nonvolatile, directly electrically readable memory device, if one assigns the low resistance stage as 0, the high resistance stage as 1, or vice versa. Electronic writing can be achieved by current-induced local magnetic field, joule heating, strain due to piezoelectric effect, or directly through electric field if material property permits. It is potentially superior to current FLASH memory or hard disk drive.

Such a tunable resistor can also be used as a sensor. One can make an array of such resistors, and prepare a suitable initial state, for example by uniform heating to above the magnetic ordering temperature. Then one brings the resistor array close to the surface of the sample under test and lets the resistors cool down. At locations where magnetic field from the sample is weak, the resistors end up in a multi-domain state, with low resistance; at locations where magnetic field from the sample is strong, a single-domain state is favored, thus the resistance is higher. This way one can rapidly obtain a spatially resolved map of the magnetic field strength distribution at the sample surface.

To our knowledge, this working principle is novel, mainly because of the lack of suitable magnetic insulator material: the discovery of the very first magnetic insulator with metallic DWs was just confirmed by the inventors. At the moment it works for temperatures up to ~30 K, but signature of similar property in a material that can potentially work for temperature up to ~230 K has been reported recently.

The major advantage of such nonvolatile memory over traditional magnetic memory devices is direct electrical readout. So far almost all magnetic memory devices rely on magnetic junctions that need at least two pieces of magnetic material. The maximum practical resistance contrast is also only on the order of 1. The tunable resistors described here have a direct, large resistance contrast, due to the orders of magnitude difference in conductivity between the DWs and the bulk.

Comparing to electrostatically gated devices, or FLASH, the resistors described here should be more stable, potentially holding data practically permanently.

Conductive ferroelectric-DW-based memory devices have been considered in the art, but such devices require high voltage pulling of ferroelectric domains and thus usually suffer from a smaller number of working cycles. By switching magnetic domains, no underlying crystal structure is changed during writing/reading for the magnetically tunable resistor, thus one would expect it to be much more durable.

DETAILED DESCRIPTION

Figure 1:
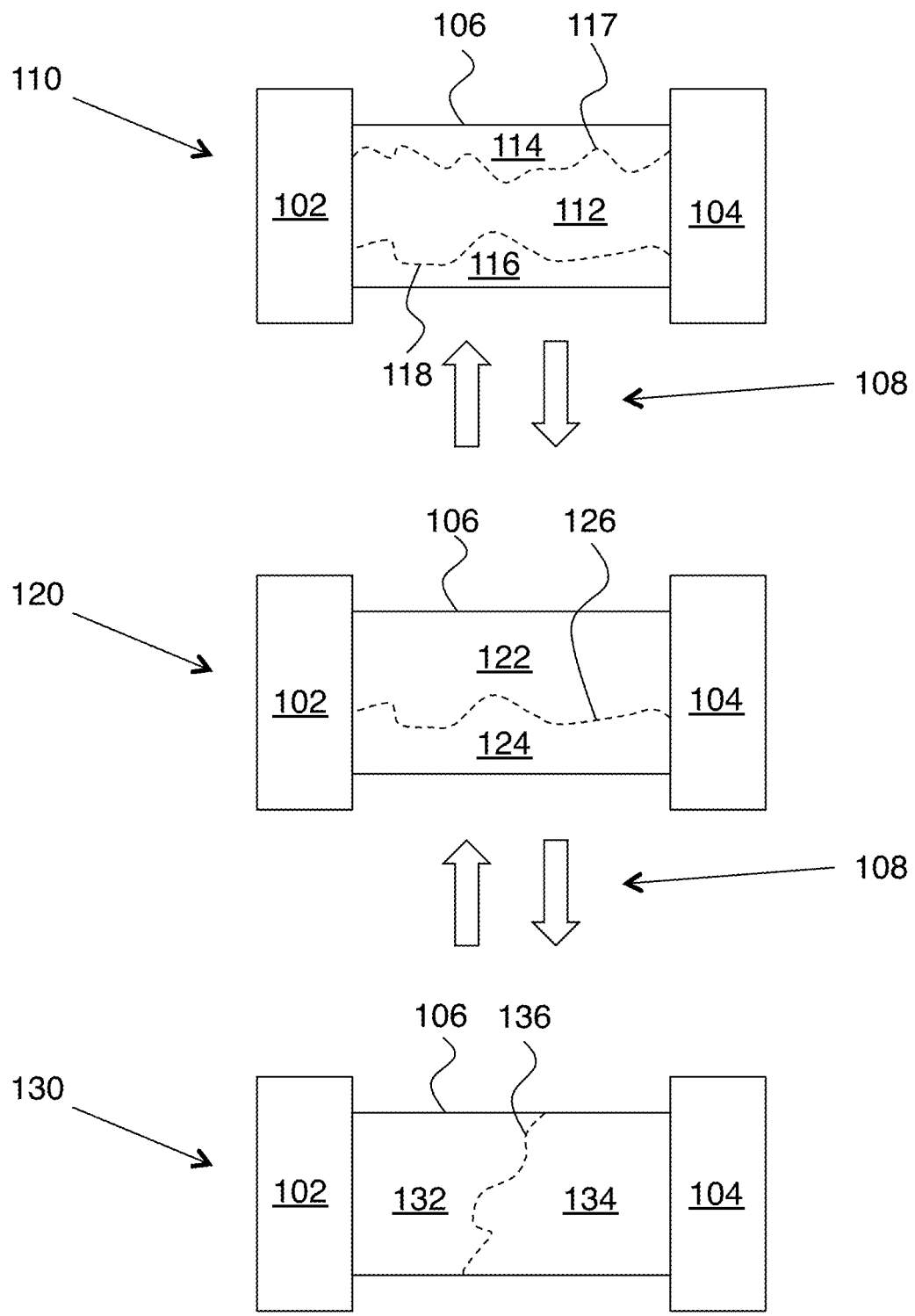
FIG. 1 shows an exemplary embodiment of the invention.

Section A provides a description of general principles relating to embodiments of the invention, and section B provides an experimental demonstration.

A) General Principles

This work relates to electrically conductive domain walls that separate domains that differ only in their magnetic configuration. In other words, the domains have the same material composition and also do not differ in any non-magnetic properties (e.g., electrical polarization, strain etc.). Prior work by others on electrically conductive domain walls has only experimentally demonstrated the effect in relation to ferroelectric materials, where the domains differ at least in terms of electrical polarization, lattice distortion and possibly in other properties as well. The present work provides a significant advantage relative to the ferroelectric prior art because altering magnetic domain wall configurations tends to be easier and faster than altering ferroelectric domain wall configurations, as well as providing improved device durability.

However, non-trivial advances relative to the state of the art were needed to demonstrate electrically conductive domain walls in purely magnetic materials. This can be appreciated by noting that ferroelectric domain walls can be expected to have a direct effect on local electrical conductivity (e.g., by accumulation of mobile charges at the domain walls), while the effect of magnetic domain walls on local electrical conductivity is necessarily indirect. Variations in magnetic order have no direct effect on charge distribution. In fact, many years passed between the earliest theoretical suggestions that this phenomenon might be possible and its experimental demonstration in the present work.

The above-described effect of electrically conductive magnetic domain walls has been experimentally demonstrated in $Nd_2Ir_2O_7$ as described in section B below. To the best of our knowledge, this is the first experimental demonstration of this effect in any material. Other materials are also expected to be suitable for practicing the invention. Selection of suitable materials is based on several physical principles: 1) metal insulator transitions, 2) anisotropic magnetic order, and 3) the possible relevance of a Weyl semimetal phase. These principles may apply separately or in any combination, although a combination of #1 and #2 is presently believed to be most promising, and each is considered in greater detail below.

A true metal insulator transition (MIT) means that the material is metallic and non-magnetic at high temperatures, and becomes non-metallic (i.e., an insulator or semiconductor) with magnetic order at low temperatures. The high temperature metallic non-magnetic phase ensures the possibility that in the low temperature magnetic insulator phase, when the magnetic order is locally disturbed at magnetic domain walls, metallic behavior may be restored. This property of exhibiting a metal-insulator transition often results from a moderate amount of electron correlation.

Another important factor is anisotropic magnetic order in the low temperature insulating or semiconducting phase. This means that the spins are firmly locked to certain crystal orientations and therefore cannot rotate continuously across the domain wall, as in a normal Bloch or Neel type ferromagnetic domain wall. Instead, the spins have to vanish abruptly within a few unit cells from the domain wall, thereby generating a strong local disturbance to the magnetic order, which may in turn restore the metallic behavior of the non-magnetic phase locally. Such anisotropic magnetic order is usually found in heavy-element (atomic number $>=37$) compounds with strong spin-orbit coupling.

The synergy of moderate electron correlation, strong spin-orbit coupling and broken time-reversal symmetry (by the magnetic order) is also the recipe of exotic topological phases like the Weyl semimetal. We note here that a Weyl semimetal phase near the MIT transition temperature could help make the metallic states at the domain wall more stable vs. small perturbations and impurities, and thus improve the conductivity at the domain walls, and the overall conductivity contrast between the domain wall and the bulk material.

Suitable candidate materials in accordance with these principles include, but are not limited to: transition metal and rare-earth iridates, transition metal and rare-earth osmium oxides, and lead or bismuth compounds with metal-insulator transitions.

FIG. 1 shows an exemplary embodiment of the invention that makes use of the above described principles. In this example, a nonvolatile tunable resistor includes a first electrode 102, a second electrode 104, and an active medium sandwiched between the two electrodes. The active medium includes a region 106 having uniform material composition. Preferably this region of uniform material composition forms the entire active medium, as shown on FIG. 1. However, practice of the invention does not critically depend on this geometry, and the active region can include other structures in addition to region 106, provided that region 106 determines device performance as described below.

Region 106 includes one or more magnetic domains. For example, magnetic domains 112, 114, 116 in device configuration 110, magnetic domains 122 and 124 in device configuration 120, and magnetic domains 132 and 134 in device configuration 130. The magnetic domains differ only in their magnetic configuration. An electrical resistance between the first and second electrodes is substantially determined by a configuration of the magnetic domains according to magnetic domain wall conductivity. Thus device configuration 110 is a relatively low resistance state because domain walls 117 and 118 contribute to conduction between electrodes 102 and 104. Device configuration 120 is a somewhat higher resistance state, because there is only one domain wall 126 that contributes to conduction between electrodes 102 and 104. Device configuration 130 is a high resistance state because domain wall 136 does not contribute to conduction between electrodes 102 and 104. A similar high level of resistance as in configuration 130 would be seen if region 106 were a single domain. Thus it is apparent that the magnetic domain configuration affects electrical conductivity by way of the presence or absence of magnetic domain walls. If magnetic domain walls are present, the electrical conductivity depends on the detailed configuration of the domain walls.

The configuration of the magnetic domains can be altered by application of a tuning input to the nonvolatile tunable resistor. This is schematically shown on FIG. 1 as a tuning input 108, capable of switching the device between configurations 110, 120 and 130 on FIG. 1.

The material composition of region 106 is preferably a material having a metal-insulator phase transition between a metallic phase that is electrically conductive and a non-metallic phase having reduced electrical conductivity relative to the metallic phase. The material composition is also preferably a material having anisotropic magnetic order in the non-metallic phase.

Figure 2:
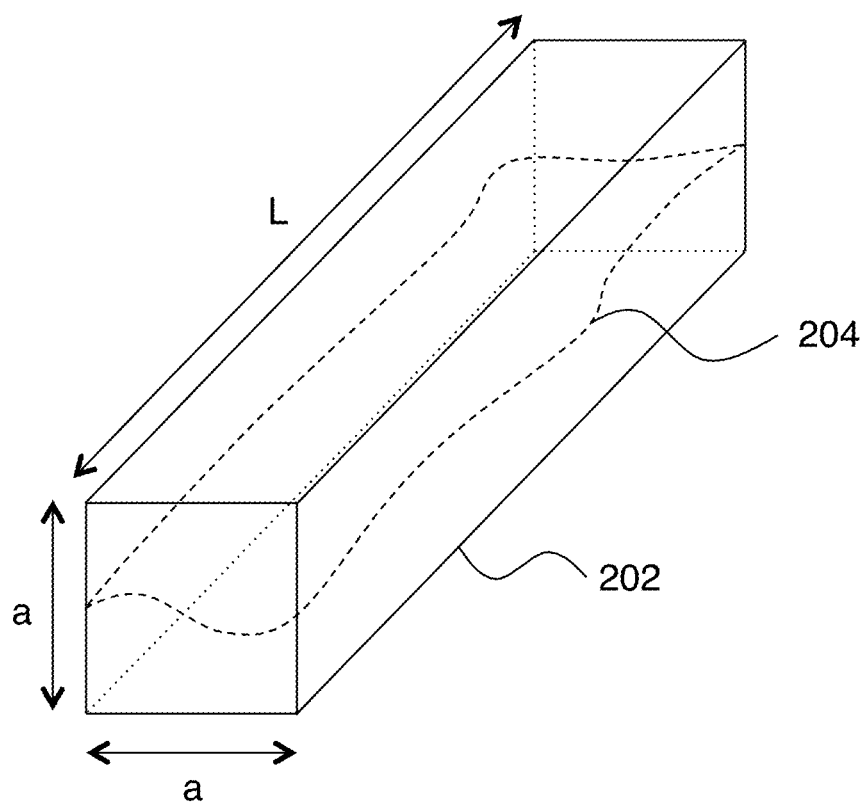
FIG. 2 shows an exemplary active region geometry.

In this work, the goal is for the electrical resistance to be dominated by the magnetic domain configuration. More specifically, the geometry of the active medium is preferably configured such that altering the configuration of the magnetic domains can vary the electrical resistance by a factor of 10 or more. FIG. 2 provides an example of how this resistance ratio can be defined.

Bulk material is characterized by a bulk resistivity ρ, while two-dimensional domain walls are characterized by a sheet resistance $R_s$. The contributions these effects make to total resistance is determined by the device geometry. For example, suppose the active region is configured as a square prism having dimensions a×a×L, the device electrodes are on the a×a faces of the prism, and a single domain wall is present as shown in FIG. 2. Then the bulk resistance is $R_b=\rho L/a^2$, the domain wall resistance is $R_{DW}=R_s L/a$, and the total resistance $R_t$ is given by solving $1/R_t=1/R_b+1/R_{DW}$. Since the domain wall of this example is connecting the electrodes, this would be the relatively low resistance state of the device. In a second high resistance configuration (not shown on FIG. 2) the magnetic domain configuration is altered such that no domain walls connect the two electrodes, and the resulting resistance is the bulk resistance $R_b$. Thus in this example, the low resistance state has resistance $R_t$ and the high resistance state has resistance $R_b$. Preferably the contrast in resistance between these two states is a factor of 10 or more (i.e., $R_b/R_t \geq 10$). Similar considerations can be applied to other geometrical configurations of the active region and/or to other configurations of the domain walls in various device states. For a fixed apect ratio (L/a), the resistance contrast $R_b/R_t$ increases as L decreases, making this approach highly suitable for scaling down to microelectronic device dimensions.

Various possibilities exist for tuning input 108. These include, but are not limited to: magnetic field, thermal treatment, strain (which can affect the magnetic domain configuration via magnetostriction), and electric field (spin-orbit coupling in principle allows control of magnetic domains via electric field and the resulting current).

The nonvolatile tunable resistor can be configured as an information storage device or as a sensor.

B) Experimental Demonstration

Magnetic order, in particular antiferromagnetism, often accompanies metal-insulator transitions (MIT), during which metallic materials abruptly become insulating or semiconducting at certain critical temperatures. Whether metallic behavior can be recovered in these magnetic insulators at magnetic domain walls (DWs) where the order is inevitably disturbed, is a long-standing question that is widely addressed theoretically but remains elusive experimentally. A related but distinct situation is that of conductive ferroelectric DWs in ferroelectric insulators, the discovery of which has opened a broad field of research dedicated to understanding the fundamental mechanism as well as making practical ferroelectric DW-based devices. However, among the vast array of magnetic insulators, no conductive magnetic DW has been firmly identified so far. Recently, bulk measurements have provided signatures of possible DW conduction in the low-temperature insulating phase of $Nd_2Ir_2O_7$, a candidate for the exotic "Weyl semimetal" with an unusual all-in-all-out magnetic order. Here we combine bulk measurements with local-conductivity-measuring microwave impedance microscopy (MIM) to directly resolve highly conductive DWs in $Nd_2Ir_2O_7$ in real space. These results rule out alternative contributions to conductivity and thus provide direct evidence for electrically conductive magnetic domain walls.

Figure 3A:
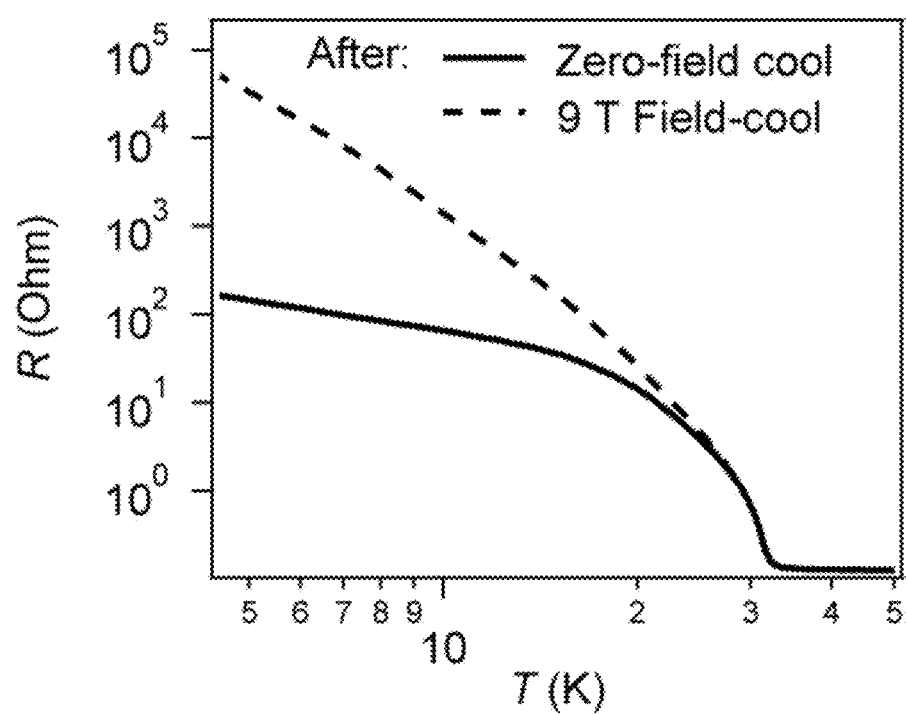
FIG. 3A shows bulk resistance vs. temperature in the experiments of section B below.
Figure 3B:
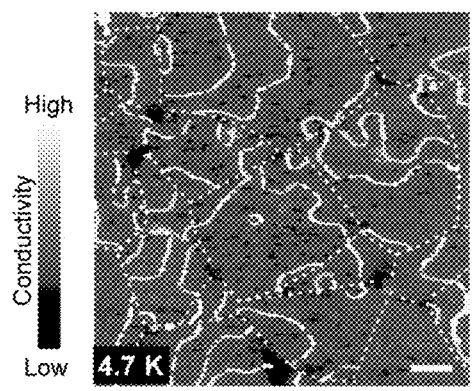
FIGS. 3B-D show spatially resolved conductivity in the experiments of section B.
Figure 3C:
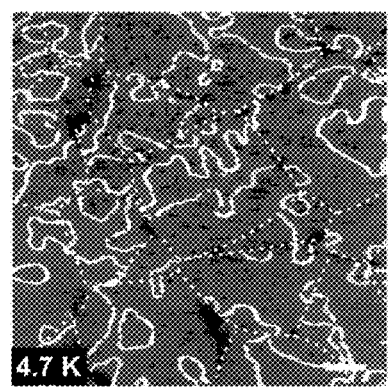
Figure 3D:
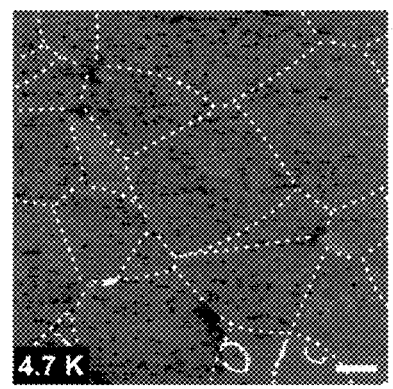

FIG. 3A show 4-terminal resistance of a macroscopic $Nd_2Ir_2O_7$ polycrystal taken during zero-field warming after cooling in zero field (untrained) and 9 T field (trained) from 50 K. FIG. 3B shows an 18×18 μm microwave impedance microscopy (MIM) image of a polished $Nd_2Ir_2O_7$ polycrystal surface, after zero field cool from 40 K to 4.7 K. Higher MIM signal corresponds to a higher local conductivity. The dotted lines are grain boundaries and the dark spots are voids between grains. FIG. 3C shows the same region as FIG. 3B (with a small offset) after a thermal cycle to 40 K and back to 4.7 K in zero field, showing randomized domains. FIG. 3D shows the same region after a thermal cycle to 40 K and cooling back to 4.7 K in 9 T. Most grains become single-domain, agreeing with transport. The scale bars are 2 μm.

$Nd_2Ir_2O_7$ is a pyrochlore iridate in which the electronic states near Fermi energy are dominated by $t_{2g}$ electrons from Ir atoms. It undergoes an MIT at $T_N\sim32$ K (FIG. 3A) with a concomitant all-in-all-out (AIAO) magnetic order developing for the Ir magnetic moments: the Ir moments at the 4 vertices of each corner-sharing tetrahedra all point either inward or outward in an alternating manner. This unusual magnetic order is a ferroic order of magnetic octupole, and preserves the symmetry of the underlying lattice. For a given lattice, there are two and only two distinct variations of the order: all-in-all-out (AIAO) and all-out-all-in (AOAI). They represent opposite magnetic octupoles and are interchanged with each other by time-reversal transformation; on the other hand, their electronic properties should be identical in absence of external perturbations.

Nonetheless abnormal conduction can happen at the boundaries between AIAO and AOAI domains (i.e. magnetic DWs): the resistance of the same polycrystalline sample at 4.5 K after cooling from above $T_N$ in zero field (ZFC or "untrained") can be more than 200 times smaller than that cooled in a 9 T field (FC or "trained") (FIG. 3A). One may attribute the extra conduction to DWs, with field cooling resulting in fewer magnetic domains, fewer DWs and thus higher overall resistance. However alternative explanations, including history-dependence of the bulk and grain boundaries, cannot be ruled out by these macroscopic measurements. Thus earlier work by some of the co-inventors on such macroscopic measurements does not demonstrate conductive magnetic domain walls.

We confirm the existence of highly conductive magnetic DWs by direct imaging with microwave impedance microscopy (MIM). MIM is a scanning probe technique that probes local conductivity by measuring tip-sample impedance at ~1 GHz: more conductive regions screen the microwave electric field better, resulting in a smaller tip-sample impedance. Working at high frequency eliminates the need of a back electrode and a complete current path, making MIM ideal for bulk insulating samples. FIG. 3B is a 18 by 18 μm MIM scan of a polished $Nd_2Ir_2O_7$ polycrystal surface at 4.7 K after cooling in zero field (untrained). Smooth curvilinear features that are much more conductive than the bulk exist in all grains, with an apparent width of ~100 nm, similar to the spatial resolution of MIM in this particular experiment. They are continuous within individual grains, show no preferred orientations, and either form closed loops or terminate at the grain boundaries, but never form vertices. As a result, each grain is divided into regions that can be assigned using only two labels, as expected for AIAO order which has only two variations. Interestingly, many DWs from adjacent grains are in close proximity at the grain boundaries. Such proximity may facilitate transport across grain boundaries and enhance the DW contribution to the measured conductance in macroscopic polycrystalline samples. We stress here that the grain boundaries themselves are as insulating as the bulk, thus their contribution to the extra conduction can be ruled out. Remarkably, while the domains are stable against heating to below $T_N$, they are completely randomized after a thermal cycle to above $T_N$ (FIG. 3C), indicating that they are tied to the AIAO order, and are not pinned by quenched disorders. It also implies that the system randomly evolves into one of the many near-degenerate multi-domain states with substantial energy barriers in between. Finally, most conductive features disappear after cooling in 9 T field (trained), in agreement with transport results. The evidence above supports the conductive curves being AIAO magnetic DWs, with conductivity much enhanced in comparison to the bulk.

A multi-domain ground state reproducible between thermal cycles is recovered if cooled in a field of 0.1 T and higher, with an unexpected dependence on the field magnitude. For cooling in very small fields (<~0.02 T), the DWs remain abundant and randomized between thermal cycles as in the ZFC case). As the field is increased to ~0.1 T, the number of DWs within each grain decreases; in the meantime, DW configuration becomes mostly reproducible between thermal cycles, indicating a well-defined multi-domain ground state. Interestingly, while the number of DWs remains largely stable up to 3 T, the detailed DW configuration changes unmistakably as a function of field magnitude. This indicates competition of AIAO and AOAI coupled to local degrees of freedom, for example strain/stress via the magnetostriction effect. Above ~3 T, a single-domain ground state quickly becomes favorable, likely due to field response of the much larger Nd moments, coupled to Ir moments through f-d coupling, and the resistance increases rapidly. Nevertheless a few grains remain multi-domain even if cooled in 9 T, the origin of which can be well explained with crystal orientation dependence, as discussed below.

Field response of the DWs at a fixed temperature clearly demonstrates the expected crystal orientation dependence of AIAO magnetic order. DWs are seen to disappear abruptly at grain-specific critical fields that depend on the crystal orientation. This is in excellent agreement with expectations from the symmetry of AIAO order: magnetic field along [111] gives rise to the largest difference in spin canting between AIAO and AOAI, while field along [001] gives rise to equivalent perturbations in the two variations, connected by a simple 90° rotation along [001]. Therefore the critical field should be smallest when applied in [111] direction, and largest in direction, regardless of the detailed mechanism. These observations further corroborate the identification of the conductive curves as AIAO DWs.

Figure 4:
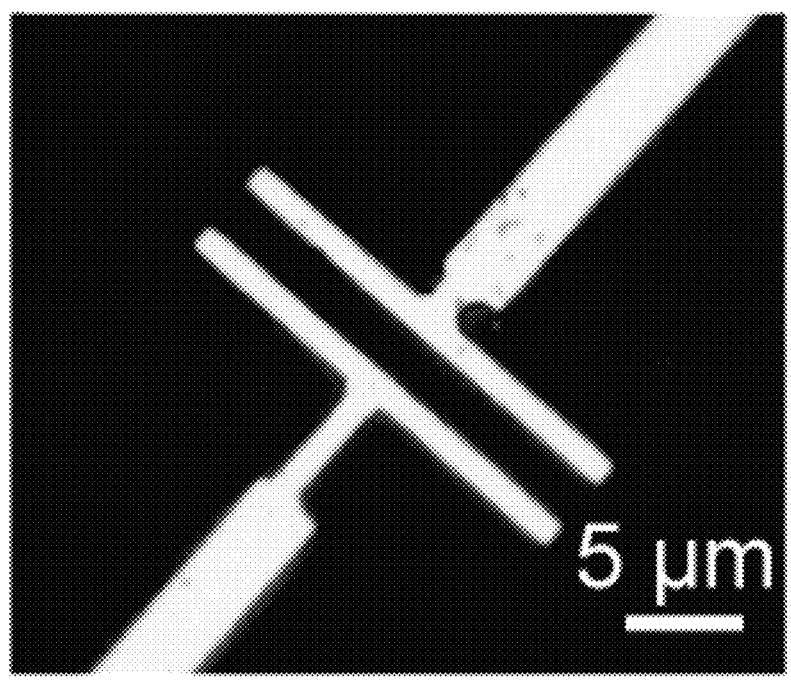
FIG. 4 shows a fabricated device for the experiments of section B.
Figure 5:
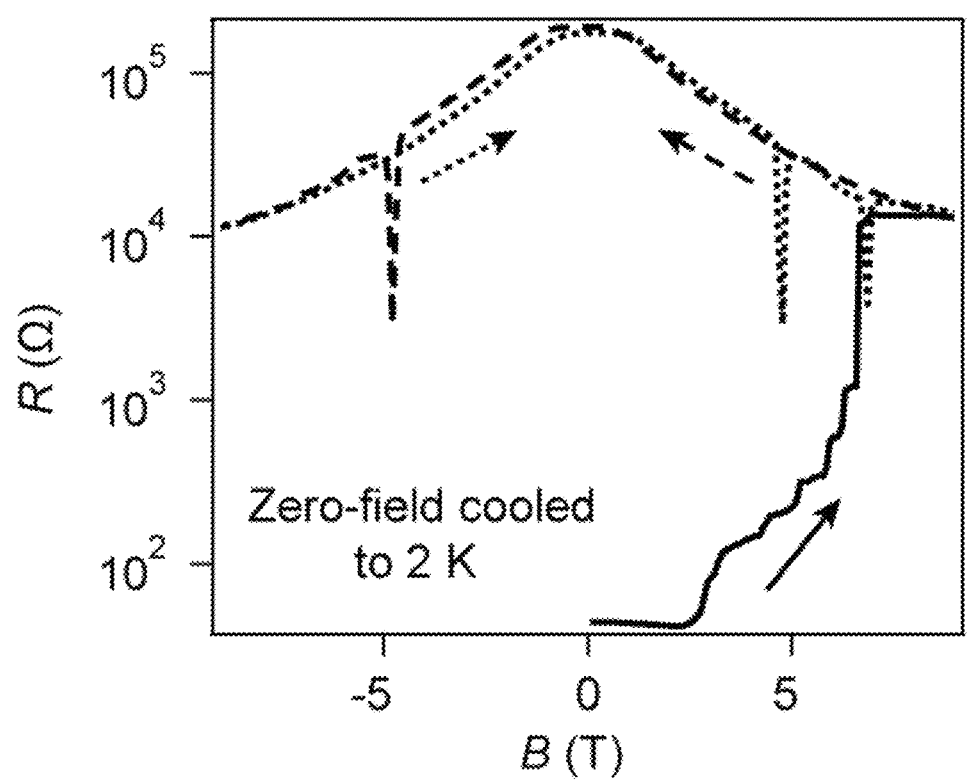
FIG. 5 shows resistance vs. magnetic field sweep for the experiments of section B.

The sheet resistance of a single DW averaged over mesoscopic lengths is ~1 kΩ/sq. This value was obtained by fabricating micro-electrodes on the sample surface to measure transport directly across a few grains (FIG. 4). FIG. 5 shows a typical resistance vs. magnetic field plot of such devices at 2 K when sweeping the field from 0 to 9 T (solid trace), 9 to −9 T (dashed trace) and −9 to 9 T (dotted trace) after a ZFC. Discrete resistance jumps and sharp resistance minimums are shown. During the initial field sweep from 0 to 9 T (solid trace), resistance increases in discrete steps, reflecting the abrupt disappearance of DWs in each grain contacted by electrodes.

Figure 6:
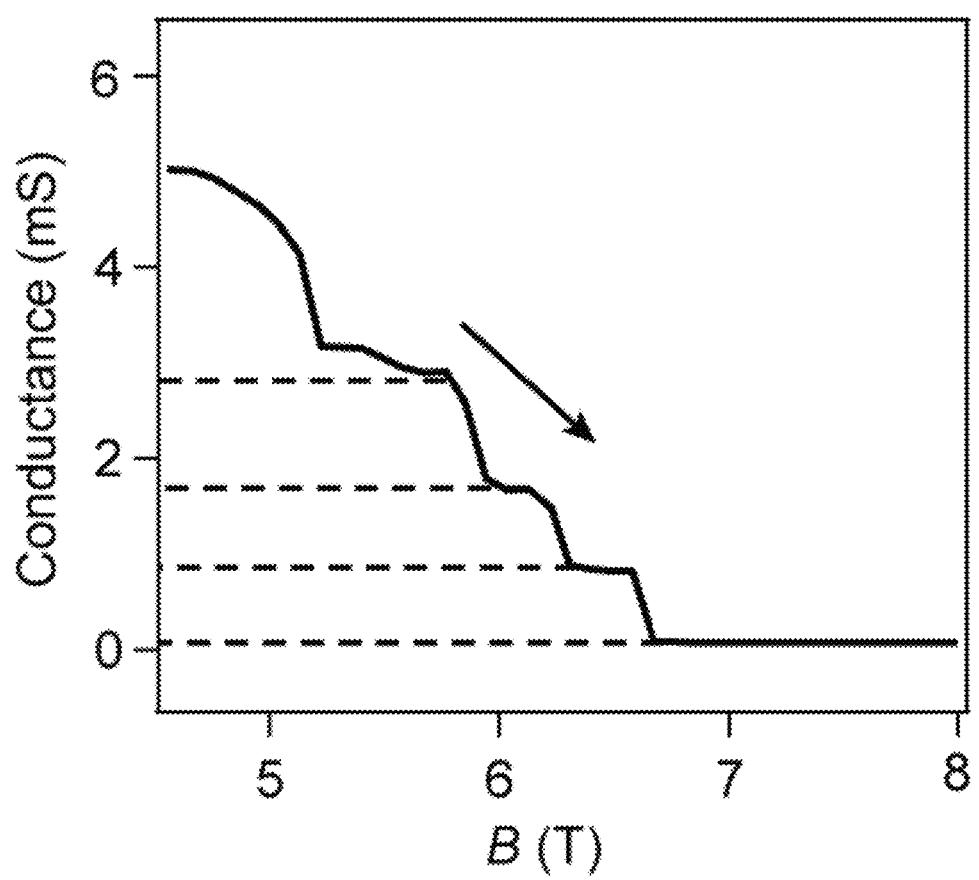
FIG. 6 shows conductance corresponding to the solid trace on FIG. 5.

FIG. 6 shows the initial sweep (solid trace) of FIG. 5 converted to conductance, showing staircase-like conductance drops. By converting resistance into conductance we notice that the decreases in conductance associated with each jump are remarkably similar, at ~1 mS (FIG. 6).

Assuming 1-2 DWs in each grain and an average effective aspect ratio on the order of 1, we conclude that the sheet resistance of the AIAO DW averaged over mesoscopic lengths is ~1 kΩ/sq. We note that this value is consistent with the 3D-averaged DW conductivity obtained by THz spectroscopy measurements, assuming an average DW spacing of 2 μm.

The sheet resistance of DWs has very weak temperature dependence at low temperatures and shows substantial negative magnetoresistance. We first develop a method to reliably prepare a few DWs across the electrodes by capturing transient DW formation. Following the staircase-like trace during the initial field sweep, sharp resistance minimums occur for subsequent sweeps (dashed and dotted traces in FIG. 5), due to transient DW formation during the rapid grain-wise domain reversals (from AIAO to AOAI, or vice versa), as also seen in MIM images. The extremely narrow width in magnetic field ensures that if the field sweep is stopped immediately when a resistance minimum occurs, there is typically only 1-2 DWs from a single grain across the electrodes. We find that these artificially created DWs are stable against temperature and magnetic field sweeps, as long as we stay below the critical values (i.e., below $T_N$, and between ±the critical field).

Figure 7:
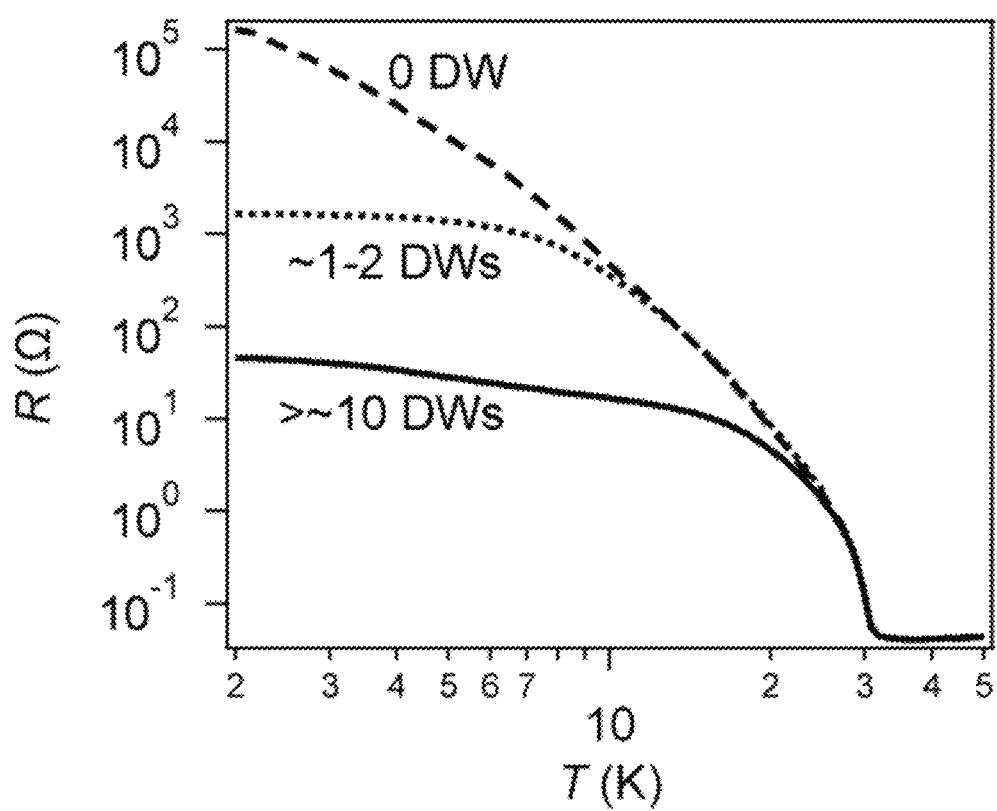
FIG. 7 shows resistance vs. temperature for a device as in FIG. 4 in the experiments of section B having several different magnetic domain configurations.

The few DWs obtained this way show Ohmic behavior and a virtually temperature independent sheet resistance until overwhelmed by bulk conduction at high temperatures. FIG. 7 shows temperature dependence of resistance for various initial states taken during zero-field warm, showing the virtually temperature-independent conduction property of a few DWs (i.e., the dotted trace for ~1-2 DWs is nearly horizontal at low temperatures). In fact, the resistance of multiple DWs only increases by ~10% cooling from 0.6 K to 35 mK, indicating a gapless electronic structure that is moderately localized due to, for example, the slow varying DW orientation. The gapless nature of the DWs is further corroborated by thermal power measurements. The DW resistance shows substantial negative magnetoresistance for fields up to ±4 T. A small minimum near zero field resembles weak anti-localization, as commonly seen in materials with strong spin-orbit coupling.

The metallic DWs result from mid-gap states that are extended within the DW plane but are localized perpendicular to it. Such "defect states" are generally present, theoretically, if the magnetically-disordered state is metallic, and the disturbance to the order parameter is sharp. Indeed metallic DWs are not observed in other $Ln_2Ir_2O_7$ (Ln=Sm, Eu, etc.) with similar magnetic order: unlike $Nd_2Ir_2O_7$, they are all semiconducting instead of metallic above the magnetic transition temperature. The highly anisotropic AIAO order is also expected to give rise to sharp DWs in $Nd_2Ir_2O_7$: the spins are locked firmly to [111] and equivalent crystal orientations via spin-orbit coupling and cannot rotate continuously across magnetic domains. The resulting sharp DWs represent abrupt disturbance of magnetic order parameter and can host mid-gap states well separated from bulk states. We note that the picture of magnetic-superlattice-driven MIT is not applicable here because AIAO order preserves the symmetry of the underlying pyrochlore lattice.

In the particular case of iridates, the above generic picture may be captured by the interface states near an exotic "Weyl semimetal" phase. The AIAO order is predicted to host a "Weyl semimetal" phase near the MIT with "Weyl fermions" in the bulk and "Fermi arc" states at the surfaces as well as interfaces between AIAO and AOAI domains. At temperatures much lower than the transition, the bulk becomes insulating as the "Weyl fermions" annihilate, and the "Fermi arc" states disappear at the surfaces. Nonetheless mid-gap states are shown to survive at the magnetic DWs. Our observation, namely metallic DWs and insulating surfaces and grain boundaries, is consistent with the prediction of this theory. A conclusive confirmation however, requires more systematic studies.

The highly conductive, mobile DWs show no preferred orientation, are free from pinning by disorders, and can be easily manipulated via heat, magnetic field and likely strain/geometry. They provide an excellent platform, scientifically for studying exotic emergent phenomena at interfaces, and practically for DW based memory devices that can be read electronically without relying on magnetic junctions. Similar properties may be present in other materials with a true MIT, and a highly anisotropic magnetic order, commonly seen in heavy-element materials with large spin-orbit coupling.

The invention claimed is:

1. A nonvolatile tunable resistor comprising:
a first electrode;
a second electrode; and
an active medium sandwiched between the first and second electrodes;
wherein the active medium comprises a region having a uniform material composition;
wherein the region includes one or more magnetic domains;
wherein the magnetic domains differ only in their magnetic configuration;
wherein an electrical resistance between the first and second electrodes is substantially determined by a configuration of the magnetic domains according to magnetic domain wall conductivity;
wherein the configuration of the magnetic domains can be altered by application of a tuning input to the nonvolatile tunable resistor.

2. The nonvolatile tunable resistor of claim 1, wherein the material composition is a material having a metal-insulator phase transition between a metallic phase that is electrically conductive and a non-metallic phase having reduced electrical conductivity relative to the metallic phase.

3. The nonvolatile tunable resistor of claim 2, wherein the material composition is a material having anisotropic magnetic order in the non-metallic phase.

4. The nonvolatile tunable resistor of claim 1, wherein a geometry of the active medium is configured such that altering the configuration of the magnetic domains can vary the electrical resistance by a factor of 10 or more.

5. The nonvolatile tunable resistor of claim 1, wherein the tuning input comprises a magnetic field.

6. The nonvolatile tunable resistor of claim 1, wherein the tuning input comprises thermal treatment.

7. The nonvolatile tunable resistor of claim 1, wherein the tuning input comprises a strain.

8. The nonvolatile tunable resistor of claim 1, wherein the tuning input comprises an electric field.

9. The nonvolatile tunable resistor of claim 1, wherein the nonvolatile tunable resistor is configured as an information storage device.

10. The nonvolatile tunable resistor of claim 1, wherein the nonvolatile tunable resistor is configured as a sensor.

* * * * *